(12) United States Patent
Lu

(10) Patent No.: US 6,989,230 B2
(45) Date of Patent: Jan. 24, 2006

(54) PRODUCING LOW K INTER-LAYER DIELECTRIC FILMS USING SI-CONTAINING RESISTS

(75) Inventor: Zhijian Lu, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 271 days.

(21) Appl. No.: 10/108,359

(22) Filed: Mar. 29, 2002

(65) Prior Publication Data

US 2003/0186172 A1 Oct. 2, 2003

(51) Int. Cl.
*G03F 7/00* (2006.01)
*G03F 7/36* (2006.01)

(52) U.S. Cl. .................. 430/313; 430/314; 430/322; 430/323; 430/324; 438/489; 216/37

(58) Field of Classification Search ............... 430/313, 430/314, 322, 323, 324; 438/489; 216/37; 427/489
See application file for complete search history.

(56) References Cited

U.S. PATENT DOCUMENTS

| | | | | |
|---|---|---|---|---|
| 5,320,934 A | * | 6/1994 | Misium et al. ............ | 430/315 |
| 5,512,334 A | * | 4/1996 | Leuschner et al. ........ | 427/558 |
| 5,910,453 A | * | 6/1999 | Gupta et al. .............. | 438/717 |
| 5,925,494 A | | 7/1999 | Horn ......................... | 430/270.1 |
| 5,960,311 A | | 9/1999 | Singh et al. ............... | 438/623 |
| 6,060,132 A | | 5/2000 | Lee .......................... | 427/579 |
| 6,103,456 A | * | 8/2000 | Tobben et al. ............ | 430/317 |
| 6,107,177 A | | 8/2000 | Lu et al. ................... | 438/397 |

(Continued)

FOREIGN PATENT DOCUMENTS

| | | | |
|---|---|---|---|
| JP | 04-176123 | * | 6/1992 |
| WO | WO 02/07214 A1 | | 1/2002 |

OTHER PUBLICATIONS

Voldman, S., et al., "High–Current Characterization of Dual–Damascene Copper Interconnects in $SIO_2$–to and Low–k Interlevel Dielectrics for Advanced CMOS Semiconductor Technologies," IEEE, $37^{th}$ Annual International Reliability Physics Symposium, San Diego, CA (Mar. 1999) pp. 144–153.

Bersuker, G., et al., "Intrinsic Electrical Properties of Cu/Low–k Interconnection," IEEE 1999 International Interconnect Technology Conference (May 24–26, 1999) pp. 173–175.

*Primary Examiner*—Nicole Barreca
(74) *Attorney, Agent, or Firm*—Slater & Matsil, L.L.P.

(57) ABSTRACT

In a process of producing low k inter-layer dielectric film in an interconnect structure on a semiconductor body, the improvement of preventing resist poisoning effects, comprising:

a) providing an interconnect structure comprising a substrate and metal line on a semiconductor body;
b) depositing an antireflective (ARC) coating layer over the substrate and metal line;
c) depositing a Si-containing resist coating on the ARC layer;
d) affecting photolithography to provide a contact hole in the Si-containing resist coating;
e) affecting silylation to obtain a Si-rich film by increasing Si content in the resist coating;
f) subjecting the Si-rich film to oxidation to convert it to a low k oxide porous dielectric film; and
g) affecting an ARC opening by removing the ARC coating in the contact hole.

24 Claims, 1 Drawing Sheet

U.S. PATENT DOCUMENTS

| | | | |
|---|---|---|---|
| 6,124,216 A | 9/2000 | Ko et al. | 438/766 |
| 6,140,023 A * | 10/2000 | Levinson et al. | 430/313 |
| 6,171,755 B1 | 1/2001 | Elian et al. | 430/270.1 |
| 6,187,672 B1 | 2/2001 | Zhao et al. | 438/639 |
| 6,348,407 B1 * | 2/2002 | Gupta et al. | 438/637 |
| 6,348,418 B1 | 2/2002 | Okamura et al. | 438/721 |
| 6,475,904 B2 * | 11/2002 | Okoroanyanwu et al. | 438/637 |
| 6,503,827 B1 * | 1/2003 | Bombardier et al. | 438/631 |
| 6,503,828 B1 * | 1/2003 | Nagahara et al. | 438/633 |
| 2002/0031719 A1 * | 3/2002 | Nakamura et al. | 430/270.1 |

* cited by examiner

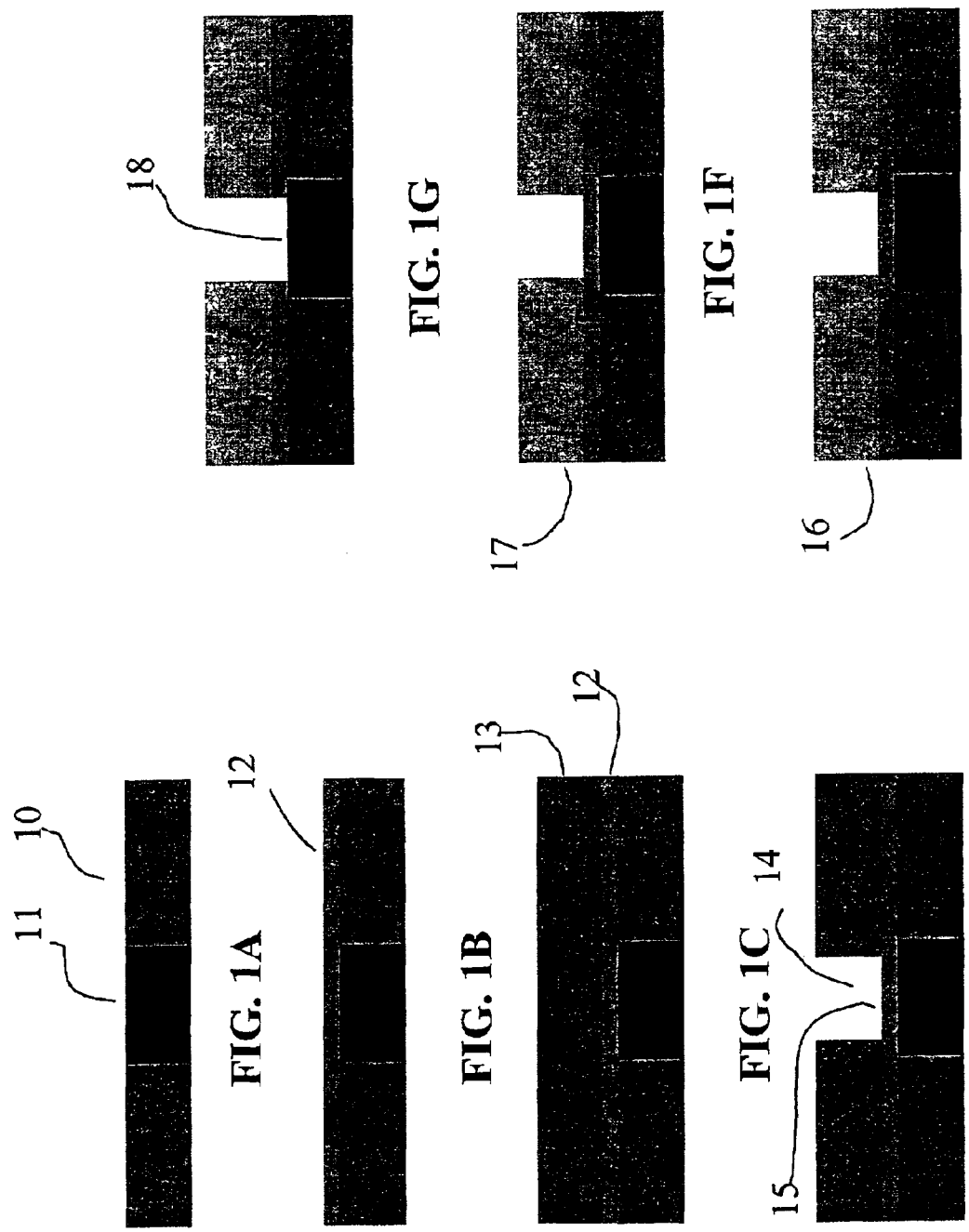

PRODUCING LOW K INTER-LAYER DIELECTRIC FILMS USING SI-CONTAINING RESISTS

BACKGROUND OF THE INVENTION

1. Field of the Invention

The invention relates to a process of providing low k inter-layer dielectric deposition films in combination with photolithography using Si-containing resists to avoid the poisoning effect traditionally imparted when using photolithography on conventional low k materials.

2. Background Art

Integrated circuits are made up of a plurality of active and passive devices that include transistors, capacitors and resistors, and these devices are initially separated or isolated from one another and later connected together in order to form functional circuits through interconnect structures. The quality of these interconnect structures significantly affects the performance and reliability of the circuits, and interconnects are increasingly determining the limits of performance as well as the density of ultra large scale integrated circuits (ULSI).

In conventional interconnect structures one or more metal layers are utilized, and each metal layer is generally made from tungsten or aluminum alloys. In these interconnect structures, interlevel and intralevel dielectrics (ILDs), typically silicon dioxide ($SiO_2$) is used to electrically isolate the active elements and different interconnect signal paths from each other. Further, in these interconnect structures, electrical connections between different interconnect levels are generally made through vias or holes formed in the ILD layers. These vias are typically filled with a metal, such as tungsten.

Lately, a great interest has been shown to replace $SiO_2$ with low-dielectric-constant (low-k) materials as the ILD in these interconnect structures. These low-k materials function as insulators in integrated circuit (IC) interconnect structures because they reduce the interconnect capacitance. As such, these low-k materials tend to increase signal propagation speed while also reducing cross-talk noise and power dissipation in the interconnect structure.

Nevertheless, the use of low-k materials as ILD in the interconnect structure still requires the use of processes that occasion technical difficulties. For example, photolithography on conventional low k materials always present challenges due to resists poisoning effects or other integration-related issues.

A chemically amplified resist for electron beam lithography is disclosed in U.S. Pat. No. 6,171,755 B1. The process for preparing a chemically amplified resist is one in which a substrate, which can be precoated with a bottom resist, is coated with a chemically amplified resist containing a polymer with dissolution-inhibiting groups that can be cleaved with acid catalysis, a photoreactive compound, which upon electron irradiation releases a sulfonic acid with a $pK_a$ value $\leq 2.5$ (photo acid generator), an electron-beam-sensitive sensitizer enhancing the exposure sensitivity of the resist, the sensitizer having the structure

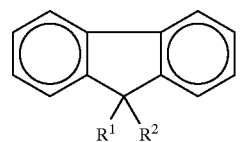

in which $R_1$=OH or OR, $R_2$=COOR where R=$C_1$ to $C_5$ alkyl; and a solvent, dried, irradiated with an electron beam, and subjected to temperature treatment (PEB) and wet development followed by silylation and dry development of bottom resist when present.

A method of preventing photoresist poisoning from dielectric antireflecting coating in semiconductor fabrication is disclosed in U.S. Pat. No. 6,103,456. The process entails:

providing a dielectric insulation layer on a surface of a semiconductor substrate having a first conductive layer disposed in a selective region thereon such that the insulation layer overlies the region of the first conductive layer;

providing a silicon oxynitride layer on the insulation layer to form a dielectric antireflective coating thereon;

providing a reactive nitrogenous substance-free dielectric spacer layer on the antireflective coating silicon oxynitride layer to prevent reactive nitrogenous substance transport therethrough from the silicon oxynitride layer;

providing a photoresist layer on the dielectric spacer layer;

selectively exposing and developing the photoresist layer to uncover selective pattern portions of the underlying dielectric spacer layer, which pattern portions are in overlying relation to the first conductive layer region in the substrate;

removing the uncovered pattern portions of the dielectric spacer layer and corresponding underlying portions of the silicon oxynitride layer for uncovering corresponding portions of the underlying insulation layer; and removing the uncovered portions of the insulation layer to uncover corresponding portions of the region of the first conductive layer in the substrate.

U.S. Pat. No. 6,187,672 B1 disclose a method for forming interconnect structures and a semiconductor body, comprising:

(a) depositing a first metal layer on a semiconductor body;

(b) depositing a sacrificial layer on the first metal layer, the sacrificial layer having a height;

(c) patterning the sacrificial layer and the first metal layer to form separate metal lines with a sacrificial layer cap on the metal lines;

(d) depositing a low-k material to fill gaps between the metal lines and to cover the sacrificial layer;

(e) removing the low-k material to a level within the height of the sacrificial layer;

(f) removing the sacrificial layer;

(g) depositing a protective layer to cover the metal lines and the low-k material;

(h) depositing an insulator on the protective layer; depositing and patterning a photoresist layer on the insulator;

(i) creating vias in the insulator;

(j) performing a photoresist strip;

(k) performing a set clean; and (l) selectively etching the protective layer using an anisotropic etch configured to leave a spacer on a vertical portion of the low-k material in the vias.

A method of forming controlled voids in interlevel dielectrics is utilized in forming an integrated circuit in U.S. Pat. No. 5,960,311. The method comprises:

forming a insulation layer over a surface of a semiconducting surface of a body;

planarizing the insulation layer;

forming a metallization layer over the insulation layer;

patterning the metallization layer to form a plurality of metal signal lines;

forming a first conformal interlevel dielectric over the metallization layer and over the insulation layer so as to form sealed voids in the first conformal interlevel dielectric between at least some adjacent metal signal lines;

removing an upper portion of the first conformal interlevel dielectric to achieve a planar top surface, thereby exposing a first group of voids at the planar top surface and maintaining a second group of voids sealed at a depth below the planar top surface;

depositing a first flowable dielectric on the planar top surface of the first conformal interlevel dielectric filling the first group of voids; and forming a second conformal interlevel dielectric over the first flowable dielectric.

There is a need when providing low k inter-layer dielectric materials in combination with photolithography to prevent or substantially lessen resist poisoning effects and to eliminate other integration-related issues, as well as simplify the process, while simultaneously achieving lower cost than when using conventional low-k inter-layer dielectric deposition methods.

SUMMARY OF THE INVENTION

One object of the present invention is to provide a process for producing low k inter-layer dielectric deposition films while avoiding resist contamination or poisoning when using low k materials.

Another object of the present invention is to provide a method of producing low k inter-layer dielectric deposition films in combination with photolithography to alleviate resist contamination by using Si-containing resist.

In general, the invention is accomplished by:

patterning using photolithography on Si-containing resists coated on an ARC which has been deposited on a semiconductor structure in which a metal line is patterned or embedded;

silylating the structure with either wet chemicals or gases to obtain optimum Si content in the resist film;

converting the silylated structure of Si rich film to pure low k oxide by $O_2$ plasma or furnace burning, either after a dielectric ARC (DARC) opening or before the DARC opening so that, due to the porous nature of the oxide formed, a low k oxide film is obtained.

BRIEF DESCRIPTION OF THE DRAWINGS

FIG. 1 shows the process flow for producing low k oxide inter-layer dielectric film using a Si-containing resists, wherein:

FIG. 1A shows an inter-layer dielectric (ILD) having a metal line embedded or patterned therein;

FIG. 1B shows a step in which a ARC coating is deposited on the structure of FIG. 1A;

FIG. 1C shows the step of depositing a Si-containing resist coat on the structure of FIG. 1B;

FIG. 1D shows the step of subjecting the structure of FIG. 1C to photolithography;

FIG. 1E shows the step of subjecting the structure of FIG. 1D to sylilation, which can be wet or dry;

FIG. 1F shows the step of oxidizing the structure of FIG. 1E to obtain a low k oxide dielectric film; and FIG. 1G shows the step of affecting opening of the anti-reflective coating on the structure of FIG. 1F.

DETAILED DESCRIPTION OF PREFERRED EMBODIMENT OF THE INVENTION

Semiconductor photolithography generally involves a sequence of processes in which a photoresist layer is applied to a semiconductor wafer, after which the photoresist layer is exposed to radiation in a pattern corresponding to a desired semiconductor processing pattern. Thereafter, the exposed photoresist is processed to form a pattern barrier film for subsequent wafer processing. Historically, photoresist films consisted of a polymer resin, that may have contained additional optional components. The polymer-based photoresist film was processed with radiation to induce photochemical reactions in localized regions of the film corresponding to a pattern of the radiation, and these selective reactions enabled a precise optical-based mechanism for producing a desired barrier pattern in a photoresist film.

More recently, in interconnect type structures, that employ one or more metal lines or layers, wherein each metal line or layer is made from aluminum, copper, or tungsten, inter-level dielectrics (ILDs), such as silicon dioxide ($SiO_2$) or tetraethylorthosilicate (TEOS) is used to electrically isolate active elements and different interconnect signal paths from each other. The electrical connections between different interconnect levels are normally made through vias formed in the ILD layers, whereupon the vias are then filled with a metal such as tungsten. The recent keen interest to replace $SiO_2$ with low dielectric constant (low k) materials as the ILD in the interconnect structure is in large measure due to the fact that these low k materials are insulators and reduce the interconnect capacitance. In reducing the interconnect capacitance, these low k materials increase the signal propagation speed while reducing crosstalk noise and power dissipation in the interconnect.

However, photolithography on conventional low k materials presents significant challenges due to the resist poisoning effect as well as other integration-related issues.

The invention process is able to overcome the resist poisoning effect as well as other integration-related issues by using Si-containing resists.

In this connection, reference is now made to FIG. 1A which depicts a portion of semiconductor structure 10 comprising a metal line 11 embedded or patterned in the structure. The metal line may be Al, Cu, or Tungsten. As may be seen from FIG. 1B, an antireflective coating (ARC) layer 12 is deposited over the substrate and metal line to minimize reflection of light back to the photoresist to be deposited. The antireflective coating layer may be a light absorbing polymer such as polyimide. Next, as may be seen from FIG. 1C, a Si-containing resist coating 13 is deposited on the ARC layer 12, followed by affecting conventional photolithography to form a contact hole or aperture 14, as shown in FIG. 1D, where the ARC coat serves as an etch stop 15.

Following the photolithography process on FIG. 1D, silylation is affected with either wet chemicals like ($H_2N$-siloxane-$NH_2$) or gases like hexaniethyldisilazane (HMDS) to increase the Si content in the resist film as shown in FIG. 1F. The Si-rich film 16 of FIG. 1E is converted to pure oxide dielectric film may be performed either after the dielectric ARC opening or before the ARC opening. Formation of the ARC opening removes the anti reflective coating layer 12 to extend the length of the contact hole or aperture 18 as shown in FIG. 1G. Due to the porous nature of the oxide formed, a low k film is obtained.

While the invention has been described in reference to inter-layer dielectric films in an interconnect structure on a semiconductor body, it is to be understood that structures in which there is an organic layer with no ARCs may also be formed by this process.

What is claimed is:

1. A process for producing a patterned low k inter-layer dielectric (ILD, layer in an interconnect structure on a semiconductor body, comprising:
    a) providing a first ILD (inter-layer dielectric, structure comprising a metal line embedded therein;
    b) depositing an antireflective (ARC) etch stop layer over said first ILD and said embedded metal line;
    c) depositing a Si-containing resist coating or layer on the ARC layer;
    d) using photolithography to pattern an aperture in said Si-containing resist coating;
    e) affecting silylation of said Si-containing resist coating to obtain a patterned Si-rich layer by increasing Si content in the resist coating subsequent to said step of using photolithography; and
    f) oxidizing the patterned Si-rich film to convert said patterned Si-rich film layer to a patterned low k oxide porous second ILD layer for providing electrical isolation of active elements and/or interconnected signal paths.

2. The process of claim 1 wherein said metal line is selected from the group consisting of aluminum, copper or tungsten.

3. The process of claim 1 wherein said metal line is aluminum.

4. The process of claim 1 wherein said metal line is copper.

5. The process of claim 1 wherein said metal line is tungsten.

6. The process of claim 2 wherein said antireflective layer is a polyimide.

7. The process of claim wherein said step of silylation is accomplished with a wet chemical or a gas.

8. The process of claim 7 wherein said wet chemical is $H_2N$-sioxane-$NH_2$.

9. The process of claim 7 wherein said gas is hexamethyldisilane.

10. The process of claim 2 wherein said oxidizing step uses $O_2$ plasma.

11. The process of claim 3 wherein said oxidizing step uses $O_2$ plasma.

12. The process of claim 4 wherein said oxidizing step uses $O_2$ plasma.

13. The process of claim 5 wherein said oxidizing step uses $O_2$ plasma.

14. The process of claim 2 wherein said oxidizing step is by furnace burning.

15. The process of claim 3 wherein said oxidizing slep is by furnace burning.

16. The process of claim 4 wherein said oxidizing step is by furnace burning.

17. The process of claim 5 wherein said oxidizing step is by furnace burning.

18. The process of claim 1 wherein said aperture patterned in said step of using photolithography to pattern an aperture exposes an area of said ARC layer and further comprising the step of removing said exposed area of said ARC layer.

19. The process of claim 18 wherein said exposed area of said ARC layer is over said metal line.

20. The process of claim 1 wherein photolithography poisoning of said patterned low k oxide porous dielectric is reduced.

21. The process of claim 1 wherein said aperture is a contact hole or via and further comprising the step of filling said aperture with a metal.

22. The process of claim 21 wherein said metal is tungsten.

23. The process of claim 19 wherein said aperture is a contact hole or via and further comprising the step of filling said aperture with a metal.

24. The process of claim 23 wherein said metal is tungsten.

* * * * *

UNITED STATES PATENT AND TRADEMARK OFFICE
CERTIFICATE OF CORRECTION

PATENT NO. : 6,989,230 B2
DATED : January 24, 2006
INVENTOR(S) : Lu

It is certified that error appears in the above-identified patent and that said Letters Patent is hereby corrected as shown below:

Column 5,
Line 3, delete "hexaniethyldisilazane" and insert -- hexamethyldisilazane --.

Column 6,
Line 20, delete "slep" and insert -- step --.

Signed and Sealed this

Fourth Day of April, 2006

JON W. DUDAS
*Director of the United States Patent and Trademark Office*